(12) United States Patent
Seo et al.

(10) Patent No.: US 11,233,511 B2
(45) Date of Patent: Jan. 25, 2022

(54) SKEW COMPENSATION CIRCUIT AND SEMICONDUCTOR APPARATUS INCLUDING THE SAME

(71) Applicant: SK hynix Inc., Icheon-si (KR)

(72) Inventors: Young Suk Seo, Seoul (KR); Seung Wook Oh, Yongin-si (KR); Da In Im, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/142,103

(22) Filed: Jan. 5, 2021

(65) Prior Publication Data

US 2021/0126637 A1 Apr. 29, 2021

Related U.S. Application Data

(62) Division of application No. 16/659,852, filed on Oct. 22, 2019, now Pat. No. 10,924,114, which is a division of application No. 15/977,915, filed on May 11, 2018, now Pat. No. 10,491,219.

(30) Foreign Application Priority Data

Nov. 20, 2017 (KR) .................. 10-2017-0155062

(51) Int. Cl.
*G06F 1/10* (2006.01)
*H03K 19/003* (2006.01)
(52) U.S. Cl.
CPC ......... *H03K 19/00384* (2013.01); *G06F 1/10* (2013.01); *H03K 19/00323* (2013.01)
(58) Field of Classification Search
CPC .............. G06F 1/10; H03K 19/00323; H03K 19/00369; H03K 19/00384

USPC ................................................. 327/291, 292
See application file for complete search history.

(56) References Cited

U.S. PATENT DOCUMENTS

| 5,122,679 A | 6/1992 | Ishii et al. |
| 6,791,370 B1 * | 9/2004 | Morzano ............... H03K 5/151 |
| | | 327/55 |
| 7,023,252 B2 | 4/2006 | Schultz |
| 7,042,799 B2 | 5/2006 | Cho |

(Continued)

OTHER PUBLICATIONS

Chua-Chin Wang et al., IEEE Transactions on Circuits and Systems—I: Regular Papers, "On-Chip Process and Temperature Monitor for Self-Adjusting Slew Rate Control of 2 x VDD Output Buffers", Jun. 2013, pp. 1432-1440, vol. 60, No. 6, IEEE.

*Primary Examiner* — William Hernandez
(74) *Attorney, Agent, or Firm* — William Park & Associates Ltd.

(57) ABSTRACT

A skew compensation circuit includes a skew detection circuit configured to generate skew detection signals by detecting a skew characteristic of a basic logic element constituting a semiconductor apparatus, a skew compensation signal generation circuit configured to generate a skew compensation signal by comparing the skew detection signals and a plurality of reference voltages, a variable delay circuit configured to generate a compensation signal by delaying an input signal by a delay time varied according to the skew compensation signal, and a reference voltage generation circuit configured to generate the plurality of reference voltages of which offset components are compensated for according to variations of a temperature and an external voltage.

7 Claims, 9 Drawing Sheets

(56) References Cited

U.S. PATENT DOCUMENTS

| | | |
|---|---|---|
| 7,441,139 B2 | 10/2008 | Kuwata |
| 8,286,022 B2 | 10/2012 | Fung et al. |
| 8,736,321 B2 | 5/2014 | Nishiyama et al. |
| 9,025,701 B2 | 5/2015 | Itoigawa et al. |
| 2002/0112099 A1* | 8/2002 | Collier .................... H04L 25/14 710/1 |
| 2005/0195663 A1* | 9/2005 | Kwak ................. G11C 11/4076 365/194 |
| 2006/0244505 A1 | 11/2006 | Fung et al. |
| 2007/0296868 A1 | 12/2007 | Hall |
| 2008/0129357 A1* | 6/2008 | Chlipala ............... H03L 7/0814 327/161 |
| 2008/0239845 A1* | 10/2008 | Na ......................... G11C 7/222 365/194 |
| 2010/0052723 A1 | 3/2010 | Takizawa |
| 2010/0090738 A1 | 4/2010 | Changchein et al. |
| 2011/0316604 A1* | 12/2011 | Em ..................... G11C 29/023 327/333 |
| 2016/0134267 A1 | 5/2016 | Adachi |

\* cited by examiner

SKEW COMPENSATION CIRCUIT AND SEMICONDUCTOR APPARATUS INCLUDING THE SAME

CROSS-REFERENCES TO RELATED APPLICATION

The present application is a divisional application of U.S. patent application Ser. No. 16/659,852, filed on Oct. 22, 2019, which is a divisional application of U.S. patent application Ser. No. 15/977,915, filed on May 11, 2018, and claims priority under 35 U.S.C. § 119(a) to Korean application number 10-2017-0155062, filed on Nov. 20, 2017, in the Korean Intellectual Property Office, which is incorporated herein by reference in its entirety.

BACKGROUND

1. Technical Field

Various embodiments may generally relate to a semiconductor circuit, and more particularly, to a skew compensation circuit and a semiconductor apparatus including the same.

2. Related Art

As the operation speed is increased, semiconductor apparatuses need to more strictly obey fixed operation standards to ensure stable operation reliability.

However, it is difficult for the semiconductor apparatuses to obey specifications according to PVT (power, voltage, and temperature) variations as the degree of integration is increased.

Accordingly, there is a need for improvement in the operation reliability of semiconductor apparatuses by compensating skews of signals related to internal operations according to the PVT variations.

SUMMARY

Various embodiments are provided of a skew compensation circuit capable of compensating skews of signals related to internal operations in a semiconductor apparatus and a semiconductor apparatus including the same.

In an embodiment of the present disclosure, a skew compensation circuit may include: a skew detection circuit configured to generate skew detection signals by detecting a skew characteristic of a basic logic element constituting a semiconductor apparatus; a skew compensation signal generation circuit configured to generate a skew compensation signal by comparing the skew detection signals and a plurality of reference voltages; a variable delay circuit configured to generate a compensation signal by delaying an input signal for a delay time varied according to the skew compensation signal; and a reference voltage generation circuit configured to generate the plurality of reference voltages of which offset components are compensated for according to variations of a temperature and an external voltage.

In an embodiment of the present disclosure, a skew compensation circuit may include: a rectifier configured to generate a rectified voltage of which a variation in an external voltage is compensated for by rectifying the external voltage; a skew detection circuit configured to generate a first skew detection signal and a second skew detection signal using the rectified voltage by detecting threshold voltage characteristics of an NMOS transistor and a PMOS transistor; a skew compensation signal generation circuit configured to generate a skew compensation signal by comparing the first and second skew detection signals and a plurality of reference voltages; a variable delay circuit configured to generate a compensation signal by delaying an input signal for a delay time varied according to the skew compensation signal; and a reference voltage generation circuit configured to select partially divided voltages corresponding to a current temperature among a plurality of divided voltages generated using the rectified voltage and output the selected divided voltages as the plurality of reference voltages.

In an embodiment of the present disclosure, a semiconductor apparatus may include: a delay-locked loop circuit configured to generate a delay-locked clock signal using a replica circuit in which an internal delay time of the semiconductor apparatus is modeled; and a skew compensation circuit configured to generate a compensation signal by compensating a delay time offset of the delay-locked loop clock signal according to a detection result of a skew characteristic of a basic logic element constituting the semiconductor apparatus.

In an embodiment of the present disclosure, a semiconductor apparatus may include: an input buffer configured to generate an output signal by buffering an input signal and control a sink current amount according to a skew compensation signal; and a skew compensation circuit configured to generate the skew compensation signal according to a detection result of a skew characteristic of a basic logic element constituting the semiconductor apparatus.

These and other features, aspects, and embodiments are described below in the section entitled "DETAILED DESCRIPTION".

BRIEF DESCRIPTION OF THE DRAWINGS

The above and other aspects, features and advantages of the subject matter of the present disclosure will be more clearly understood from the following detailed description taken in conjunction with the accompanying drawings, in which.

DETAILED DESCRIPTION

Various embodiments of the present invention will be described in greater detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present invention as defined in the appended claims.

The present invention is described herein with reference to cross-section and/or plan illustrations of idealized embodiments of the present invention. However, embodiments of the present invention should not be construed as limiting the inventive concept. Although a few embodiments of the present invention will be shown and described, it will be appreciated by those of ordinary skill in the art that changes may be made in these embodiments without departing from the principles and spirit of the present invention, FIG. 1 is a diagram illustrating a configuration of a skew compensation circuit 100 according to an embodiment.

Figure 1:
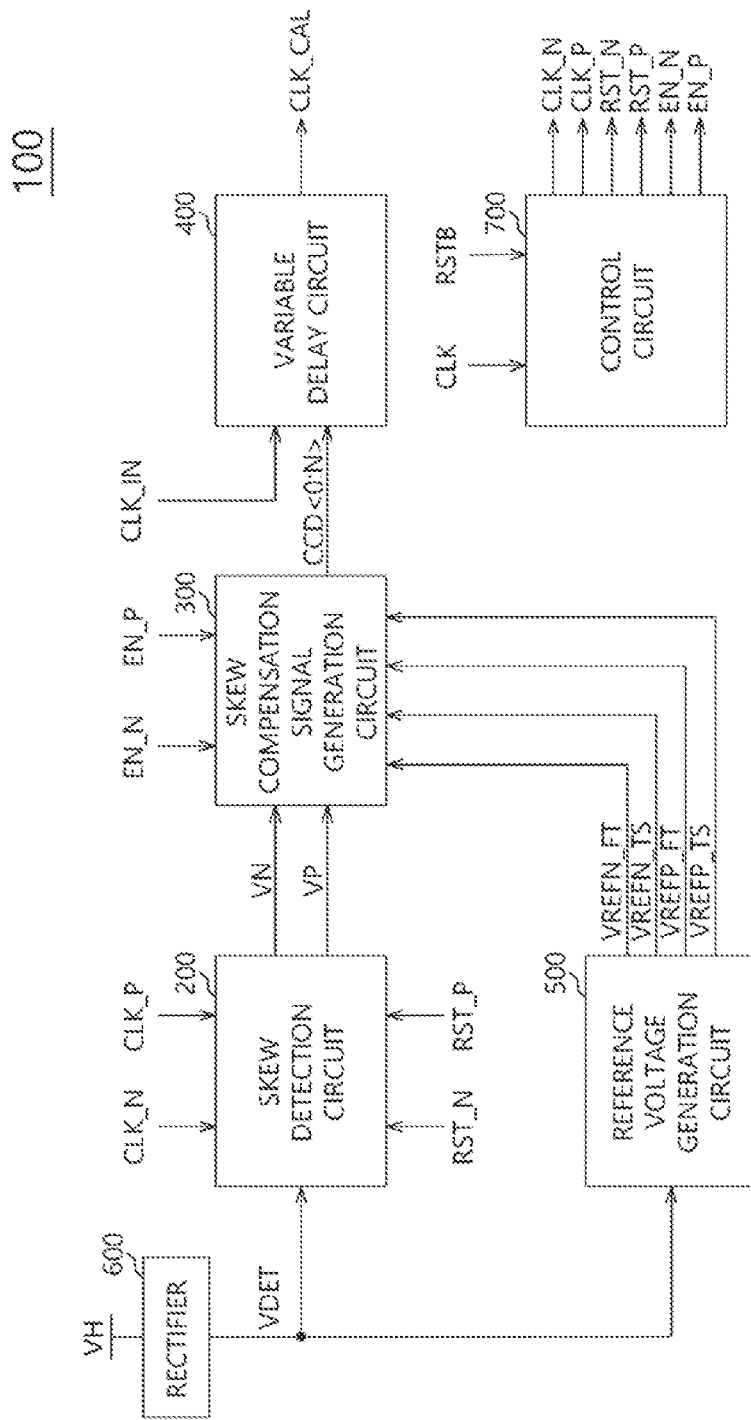
FIG. 1 is a diagram illustrating a configuration of a skew compensation circuit according to an embodiment of the present disclosure.

As illustrated in FIG. 1, the skew compensation circuit 100 may include a skew detection circuit 200, a skew compensation signal generation circuit 300, a variable delay circuit 400, a reference voltage generation circuit 500, a rectifier 600, and a control circuit 700.

The skew detection circuit 200 may generate skew detection signals, for example, a first skew detection signal VN and a second skew detection signal VP by detecting skew characteristics, for example, threshold voltage characteristics of a basic logic element, for example, transistors (an NMOS transistor and a PMOS transistor) constituting a semiconductor apparatus.

The skew detection circuit 200 may generate the first and second skew detection signals VN and VP according to a rectified voltage VDET, a first clock signal CLK_N, a second clock signal CLK_P, a first reset signal RST_N, and a second reset signal RST_P.

The skew compensation signal generation circuit 300 may generate a skew compensation signal CCD<0:N> by comparing the first and second skew detection signals VN and VP and a plurality of reference voltages, for example, first to fourth reference voltages VREFN_FT, VREFN_TS, VREFP_FT, and VREFP_TS.

The skew compensation signal generation circuit 300 may be activated according to an enable signal, for example, first and second enable signals EN_N and EN_P and perform an operation of generating the skew compensation signal CCD<0:N>.

The variable delay circuit 400 may generate a compensation signal CLK_CAL by delaying an input signal CLK_IN for a delay time varied according to the skew compensation signal CCD<0:N>.

The reference voltage generation circuit 500 may generate the first to fourth reference voltages VREFN_FT, VREFN_TS, VREFP_FT, and VREFP_TS of which offset components are compensated for according to variations of a temperature and an external voltage.

The reference voltage generation circuit 500 may select partial voltages corresponding to a current temperature among a plurality of generated voltages using the rectified voltage VDET and output the selected voltages as the first to fourth reference voltages VREFN_FT, VREFN_TX, VREFP_FT, and VREFP_TS.

The rectifier 600 may generate the rectified voltage VDET of which a variation in a power voltage VH (for example, VDD) is compensated for by rectifying an external voltage, for example, the power voltage VDD. Further, the rectifier 600 may provide to the rectified voltage VDET to the skew detection circuit 200 and the reference voltage generation circuit 500.

A low dropout (LDO) rectifier may be used as the rectifier 600.

An example where the rectified voltage VDET may be used for a stable operation is described in the embodiment, but the skew compensation circuit 100 may be configured to directly use the power voltage VDD in the skew detection circuit 200 and the reference voltage generation circuit 500. Further, the rectified voltage VDET may be generated to have a constant level regardless of a variation in the power voltage VDD by rectifying the power voltage VDD.

The control circuit 700 may generate the first clock signal CLN_N, the second clock signal CLK_P, the first reset signal RST_N, the second reset signal RST_P, and the first enable signal EN_N and the second enable signals EN_P according to a clock signal CLK and a reset signal RSTB.

The control circuit 700 may independently control toggling periods of the first clock signal CLK_N and the second clock signal CLK_P, activation periods of the first enable signal EN_N and the second enable signal EN_P, and activation timings of the first reset signal RST_N and the second reset signal RST_P in consideration of an operation characteristic difference between an NMOS transistor and a PMOS transistor.

Figure 2:
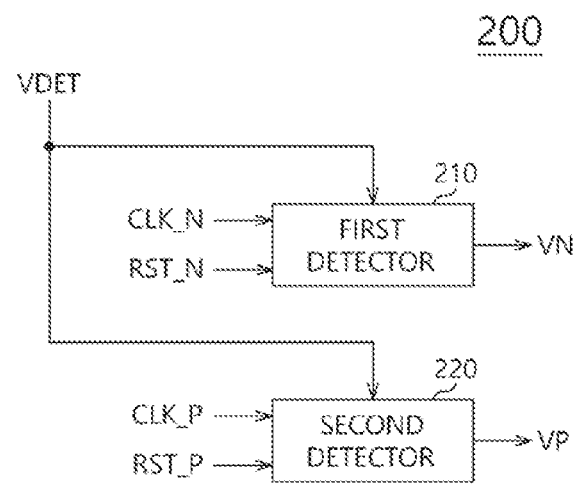
FIG. 2 is a diagram illustrating a configuration of a skew detection circuit of FIG. 1.

FIG. 2 is a diagram illustrating a configuration of the skew detection circuit 200 of FIG. 1.

As illustrated in FIG. 2, the skew detection circuit 200 may include a first detector 210 and a second detector 220.

The first detector 210 may generate the first skew detection signal VN by detecting a skew characteristic, for example, a threshold voltage characteristic of an NMOS transistor according to at least one of the rectified voltage VDET, the first clock signal CLK_N, and the first reset signal RST_N.

The second detector 220 may generate the second skew detection signal VP by detecting a skew characteristic, for example, a threshold voltage characteristic of a PMOS transistor according to at least one of the rectified voltage VDET, the second clock signal CLK_P, and the second reset signal RST_P.

Figure 3:
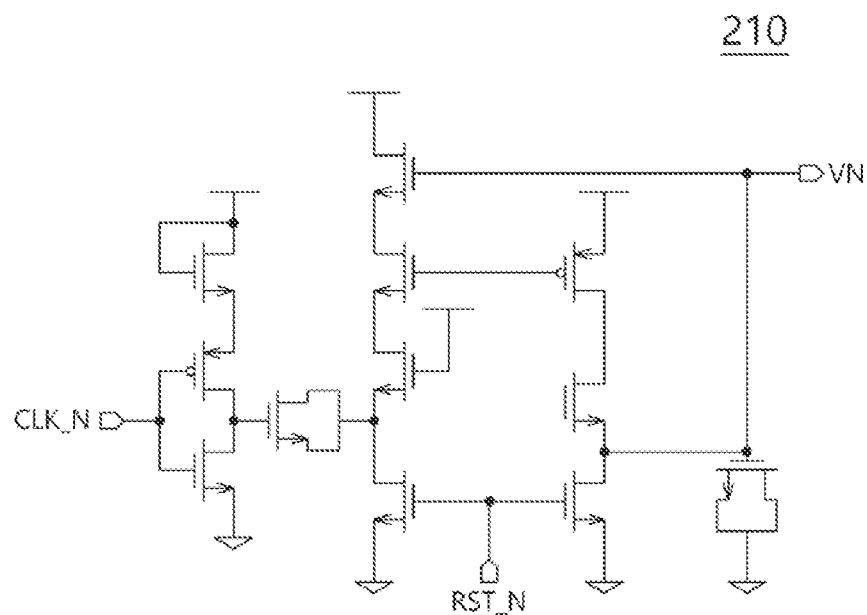
FIGS. 3 and 4 are diagrams illustrating configurations of a first detector and a second detector of FIG. 2.
Figure 4:
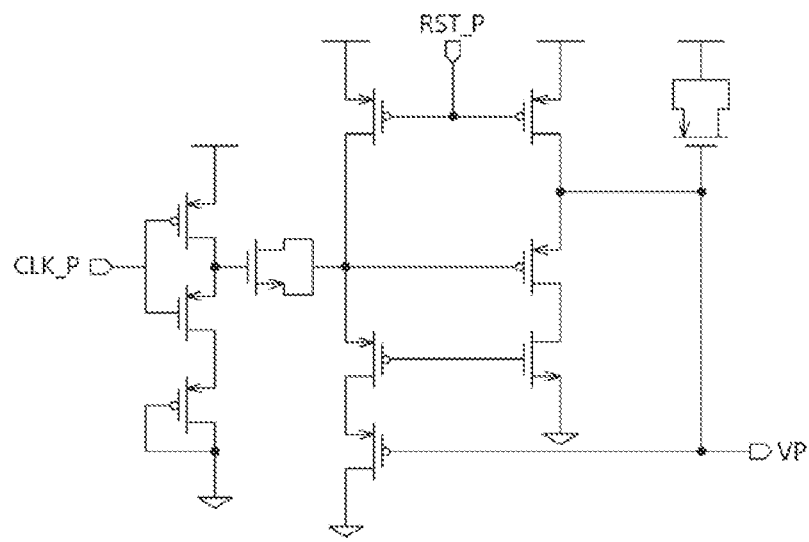

FIGS. 3 and 4 are diagrams illustrating configurations of the first detector 210 and the second detector 220 of FIG. 2.

The first detector 210 and the second detector 220 may be configured in various ways. For example, as illustrated in FIGS. 3 and 4, the first detector 210 and the second detector 220 may employ the NMOS threshold voltage detector and the PMOS threshold voltage detector disclosed in the paper "On-Chip Process and Temperature Monitor for Self-Adjusting Slew Rate Control of 2×VDD Output Buffers".

Figure 5:
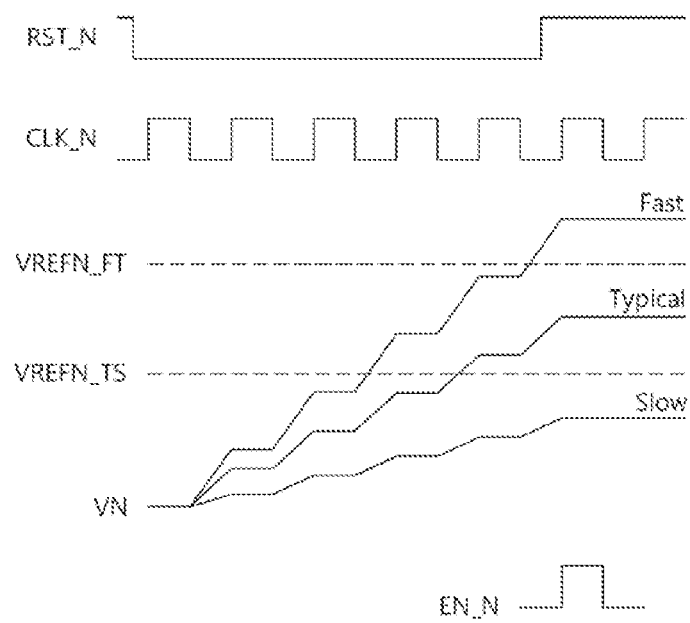
FIG. 5 is a timing diagram illustrating an operation of the first detector of FIG. 3.

FIG. 5 is a timing diagram illustrating an operation of the first detector 210 of FIG. 3.

As illustrated in FIG. 5, the first detector 210 may operate according to the first clock signal CLK_N during an inactivation period of the first reset signal RST_N and output an output signal as a final value of the first skew detection signal VN when the first enable signal EN_N is activated.

The first skew detection signal VN may have typical, fast, and slow characteristics according to typical, low, and high levels of a threshold voltage of the NMOS transistor.

Figure 6:
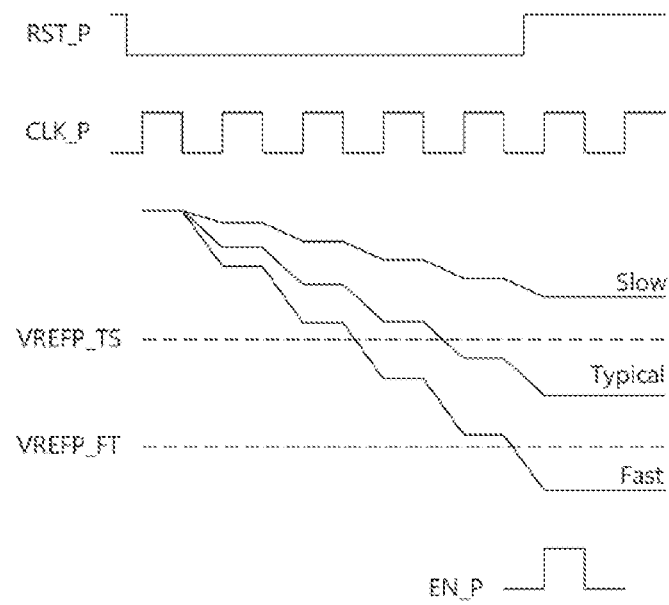
FIG. 6 is a timing diagram illustrating an operation of the second detector of FIG. 4.

FIG. 6 is a timing diagram illustrating an operation of the second detector 220 of FIG. 4.

As illustrated in FIG. 6, the second detector 220 may operate according to the second clock signal CLK_P during an inactivation period of the second reset signal RST_P and output an output signal as a final value of the second skew detection signal VP when the second enable signal EN_P is activated.

The second skew detection signal VP may have typical, fast, and slow characteristics according to typical, low, and high levels of a threshold voltage of the PMOS transistor.

Figure 7:
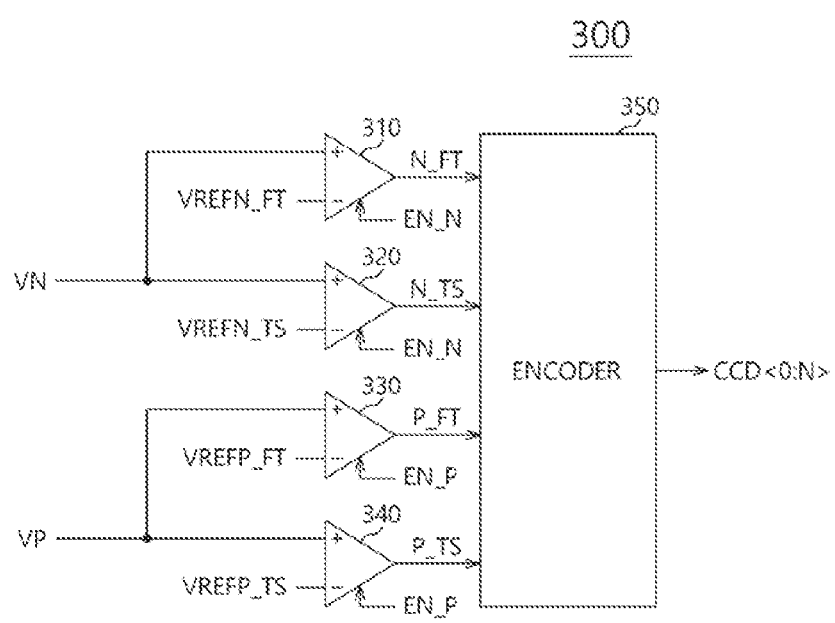
FIG. 7 is a diagram illustrating a configuration of a skew compensation signal generation circuit of FIG. 1.

FIG. 7 is a diagram illustrating a configuration of the skew compensation signal generation circuit 300 of FIG. 1.

As illustrated in FIG. 7, the skew compensation signal generation circuit 300 may include a plurality of comparators, for example, first to fourth comparators 310 to 340 and an encoder 350.

The first comparator 310 may generate a first comparison signal N_FT by comparing the first reference voltage VREFN_FT and the first skew detection signal VN during the activation period of the first enable signal EN_N.

The first comparator 310 may output the first comparison signal N_FT having a high level when a voltage level of the first skew detection signal VN is greater than or equal to the first reference voltage VREFN_FT.

The second comparator 320 may generate a second comparison signal N_TS by comparing the second reference voltage VREFN_TS and the first skew detection signal VN during the activation period of the first enable signal EN_N.

The second comparator 320 may output the second comparison signal N_TS having a high level when the voltage level of the first skew detection signal VN is greater than or equal to the second reference voltage VREFN_TS.

The third comparator 330 may generate a third comparison signal P_FT by comparing the third reference voltage VREFP_FT and the second skew detection signal VP during the activation period of the second enable signal EN_P.

The third comparator 330 may output the third comparison signal P_FT having a high level when a voltage level of the second skew detection signal VP is greater than or equal to the third reference voltage VREFP_FT.

The fourth comparator 340 may generate a fourth comparison signal P_TS by comparing the fourth reference voltage VREFP_TS and the second skew detection signal VP during the activation period of the second enable signal EN_P.

The fourth comparator 340 may output the fourth comparison signal P_TS having a high level when the voltage level of the second skew detection signal VP is greater than or equal to the fourth reference voltage VREFP_TS.

The encoder 350 may generate the skew compensation signal CCD<0:N> by encoding the first to fourth comparison signals N_FT, N_TS, P_FT, and P_TS.

Figure 8:
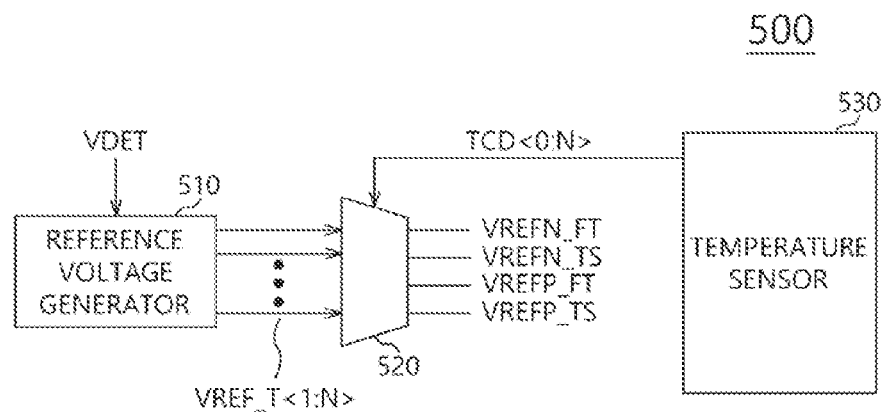
FIG. 8 is a diagram illustrating a configuration of a reference voltage generation circuit of FIG. 1.

FIG. 8 is a diagram illustrating a configuration of the reference voltage generation circuit 500 of FIG. 1.

As illustrated in FIG. 8, the reference voltage generation circuit 500 may include a reference voltage generator 510, a multiplexing circuit 520, and a temperature sensor 530.

The reference voltage generator 510 may generate a plurality of divided voltages VREF_T<1:N>.

The multiplexing circuit 520 may generate the first to fourth reference voltages VREFN_FT, VREFN_TS, VREFP_FT, and VREFP_TS by selecting partially divided voltages among a plurality of divided voltages output from the reference voltage generator 510 according to a temperature code TCD<0:N>.

The temperature sensor 530 may detect a current temperature change of a semiconductor apparatus and output the detection result as the temperature code TCD<0:N>.

A temperature compensated self-refresh (TCSR) circuit may be used as the temperature sensor 530.

Figure 9:
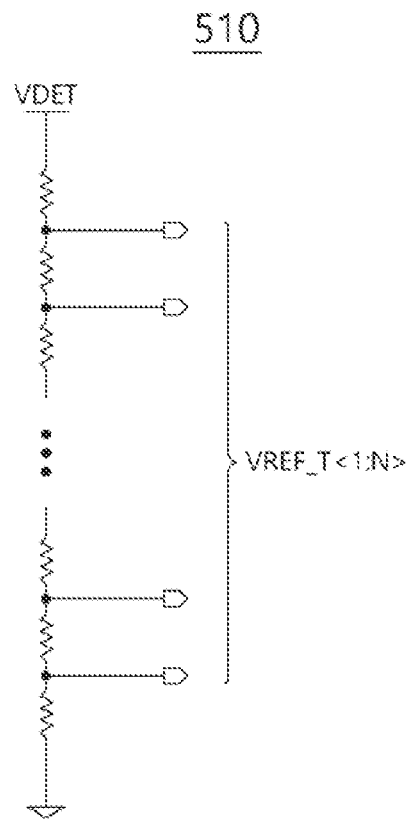
FIG. 9 is a diagram illustrating a configuration of a reference voltage generator of FIG. 8.

FIG. 9 is a diagram illustrating a configuration of the reference voltage generator 510 of FIG. 8.

As illustrated in FIG. 9, the reference voltage generator 510 may generate the plurality of divided voltages VREF_T<1:N> by dividing a level of the rectified voltage VDET through a plurality of resistors R coupled between a terminal of the rectified voltage VDET and another terminal (for example, a ground terminal).

Figure 10:
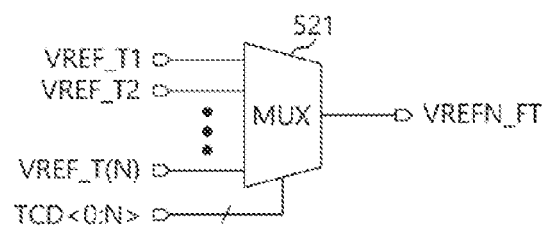
FIG. 10 is a diagram illustrating a configuration of a multiplexing circuit of FIG. 8.
Figure 10:
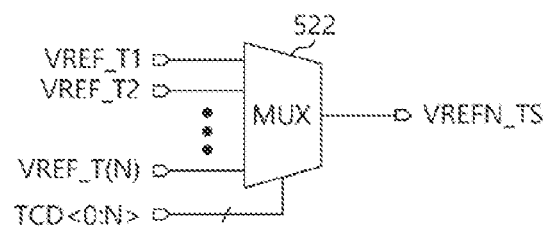
Figure 10:
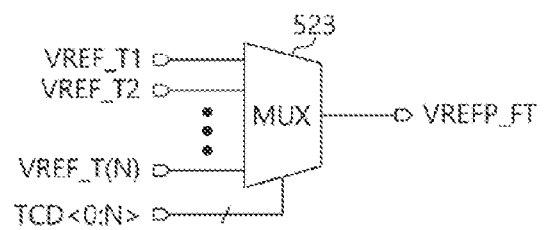
Figure 10:
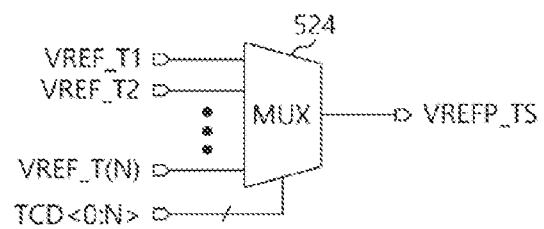

FIG. 10 is a diagram illustrating a configuration of the multiplexing circuit 520 of FIG. 8.

As illustrated in FIG. 10, the multiplexing circuit 520 may include a plurality of multiplexers, for example, first to fourth multiplexers 521 to 524.

The first multiplexer 521 may select one among the plurality of divided voltages VREF_T<1:N> according to the temperature code TCD<0:N> and output the selected divided voltage as the first reference voltage VREFN_FT.

The second multiplexer 522 may select one among the plurality of divided voltages VREF_T<1:N> according to the temperature code TCD<0:N> and output the selected divided voltage as the second reference voltage VREFN_TS.

The third multiplexer 523 may select one among the plurality of divided voltages VREF_T<1:N> according to the temperature code TCD<0:N> and output the selected divided voltage as the third reference voltage VREFP_FT.

The fourth multiplexer 524 may select one among the plurality of divided voltages VREF_T<1:N> according to the temperature code TCD<0:N> and output the selected divided voltage as the fourth reference voltage VREFP_TS.

The first to fourth multiplexers 521 to 524 may be configured to have different internal logics. Accordingly, the first to fourth multiplexers 521 to 524 may select each of the plurality of divided voltages VREF_T<1:N> according to the temperature code TCD<0:N> so that the first to fourth reference voltages VREFP_FT, VREFN_TS, VREFP_FT, VREFP_TS have different values from each other.

The skew compensation circuit 100 according to an embodiment may compensate for the offset according to an external voltage variation by allowing the skew detection circuit 200 and the reference voltage generation circuit 500 to operate based on the rectified voltage VDET having a constant level regardless of the variation in the external voltage (for example, power voltage VDD) generated through the rectifier 600. The reference voltage generation circuit 500 may also compensate for the offset according to the temperature variation using the temperature sensor 530.

Accordingly, the skew compensation circuit 100 according to an embodiment may generate a compensation signal CLK_CAL having an offset which is compensated for, where the offset may be a delay time variation according to the external voltage variation and the temperature variation.

Figure 11:
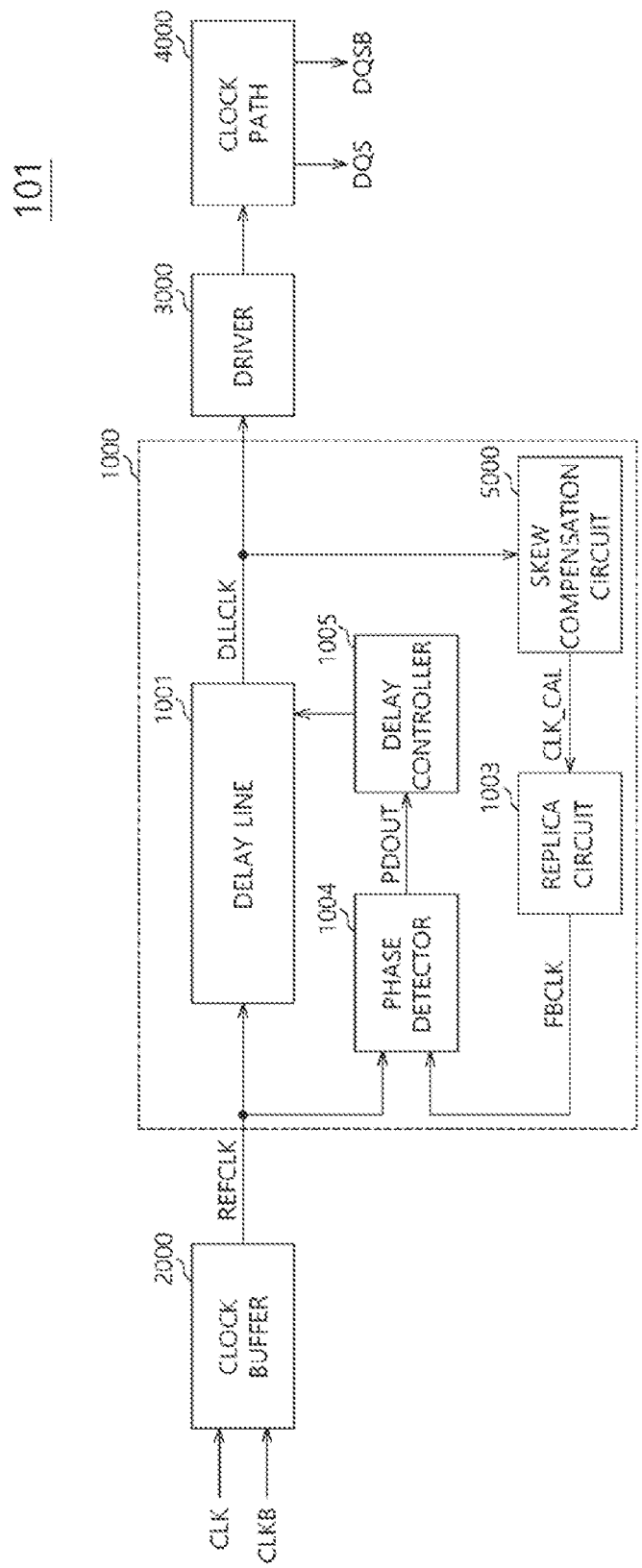
FIG. 11 is a diagram illustrating a configuration of a semiconductor apparatus according to an embodiment of the present disclosure.

FIG. 11 is a diagram illustrating a configuration of a semiconductor apparatus 101 according to an embodiment.

As illustrated in FIG. 11, the semiconductor apparatus 101 according to an embodiment may include a delay-locked loop circuit 1000, a clock buffer 2000, a driver 3000, a clock path 4000, and a skew compensation circuit 5000.

The clock buffer 2000 may output a reference clock signal REFCLK by receiving differential clock signals CLK and CLKB provided from outside the semiconductor apparatus.

The driver 3000 may drive and output a delay-locked loop clock signal DLLCLK generated from the delay-locked loop circuit 1000.

The output of the driver 3000 may be output as data strobe signals DQS and DQSB via the clock path 4000.

The delay-locked loop circuit 1000 may generate the delay-locked clock signal DLLCLK using the replica circuit 1003 having internal delay times upon which the delay times of the semiconductor apparatus are modeled.

The delay-locked loop circuit 1000 may generate the delay-locked loop clock signal DLLCLK having a delay time that is compensated for by an internal delay time of the semiconductor apparatus (for example, delay time due to the clock buffer 2000, the driver 3000, and the clock path 4000).

The delay-locked loop circuit 1000 may include a delay line 1001, a skew compensation circuit 5000, the replica circuit 1003, a phase detector 1004, and a delay controller 1005.

The delay line 1001 may output the delay-locked loop clock signal DLLCLK by delaying the reference clock signal REFCLK by a varied delay time.

The replica circuit 1003 may output a feedback clock signal FB_CLK by delaying the compensation signal CLK-_CAL by a preset delay time.

The delay time of the replica circuit 1003 may be set based on the delay time due to the clock buffer 2000, the driver 3000, and the clock path 4000.

The phase detector 1004 may generate a phase detection signal PDOUT by detecting a phase difference between the reference clock signal REFCLK and the feedback clock signal FB_CLK.

The delay controller 1005 may adjust (for example, increase or reduce) the delay time of the delay line 1001 according to the phase detection signal PDOUT.

The skew compensation circuit 5000 may generate the compensation signal CLK_CAL by compensating the delay time offset of the delay-locked loop clock signal DLLCLK according to a detection result of a skew characteristic of a basic logic circuit constituting the semiconductor apparatus.

The skew compensation circuit 5000 may employ the configuration of the skew compensation circuit 100 of FIG. 1 and the configuration and operation of the skew compensation circuit 100 are described above with reference to FIGS. 1 to 10 and thus detailed description therefore will be omitted.

In an embodiment, the skew compensation circuit 5000 may be included in the delay-locked loop circuit 1000, but the skew compensation circuit 5000 may be configured separate from the delay-locked loop circuit 1000 or may be included in the delay-locked loop circuit 1000. The skew compensation circuit 5000 may compensate for a skew of a signal used in a separate configuration from the delay-locked loop circuit 1000.

A general delay-locked loop circuit may compensate for the delay time due to the clock buffer 2000 and the delay time due to the driver 3000 and the clock path 4000 which are described above, but the general delay-locked loop circuit might not compensate for the signal delay due to the power, voltage, and temperature (PVT) variations.

However, the delay-locked loop circuit 1000 according to an embodiment may compensate for the delay time due to the clock buffer 2000, the driver 3000, and the clock path 4000 as well as the delay time due to the PVT variations as described with reference to FIGS. 1 to 10. The delay-locked loop circuit 1000 may compensate for the delay time using the skew compensation circuit 5000 and thus may further improve the operation stability of the semiconductor apparatus.

Figure 12:
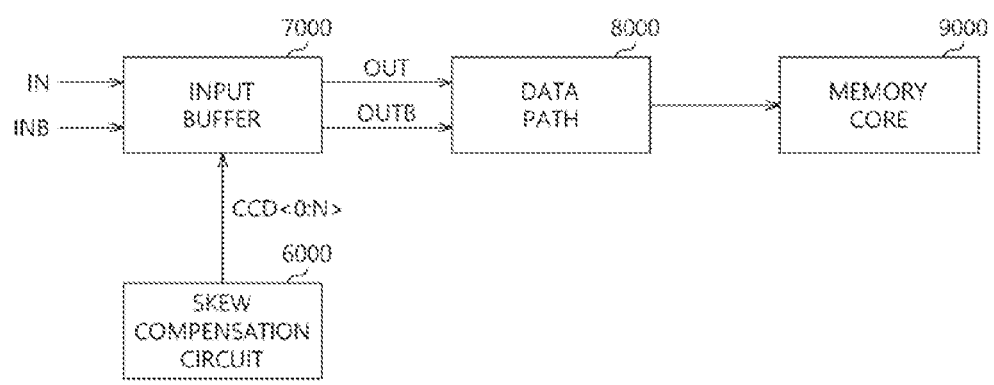
FIG. 12 is a diagram illustrating a configuration of a semiconductor apparatus according to another embodiment of the present disclosure.

FIG. 12 is a diagram illustrating a configuration of a semiconductor apparatus 102 according to another embodiment.

As illustrated in FIG. 12, the semiconductor apparatus 102 according to another embodiment may include a skew compensation circuit 6000, an input buffer 7000, a data path 8000, and a memory core 9000.

The skew compensation circuit 6000 may generate a skew compensation signal CCD<0:N> according to a detection result of the skew characteristic of a basic logic element constituting the semiconductor apparatus.

The skew compensation circuit 6000 may employ the configuration of the skew compensation circuit 100 of FIG. 1 and may use an output of the skew compensation signal generation circuit 300 as the skew compensation signal CCD<0:N>.

The skew compensation circuit 6000 may employ components other than the variable delay circuit 400 among the components of the skew compensation circuit 100 of FIG. 1.

Accordingly, a description of a configuration and operation of the skew compensation circuit 6000 will be omitted.

The input buffer 7000 may generate an output signal, for example, differential output signals OUT and OUTB by buffering an input signal, for example, differential input signals IN and INB.

The input buffer 7000 may control a sink current amount according to the skew compensation signal CCD<0:N>.

The sink current amount may be controlled according to the skew compensation signal CCD<0:N> and thus gain and bandwidth variations of the input buffer 7000 according to the PVT variations may be reduced.

The memory core 9000 may include circuit components related to a memory array and data input/output of the memory array.

The differential output signals OUT and OUTB output from the input buffer 7000 may be recorded in the memory core 9000 via to the data path 8000.

Figure 13A:
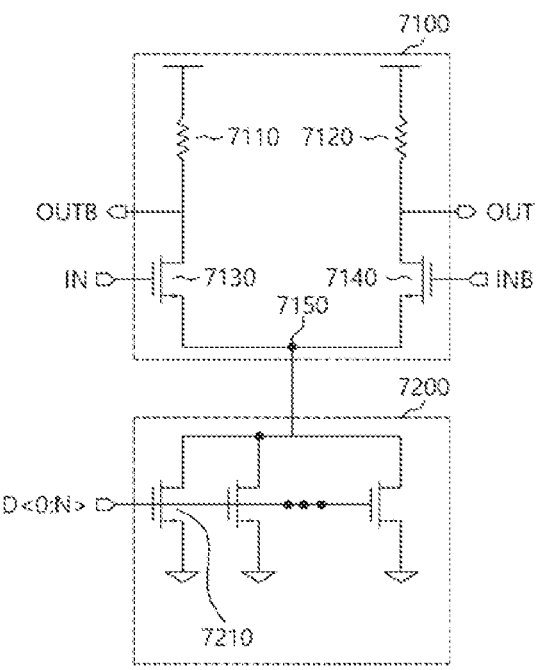
FIGS. 13A and 13B are diagrams illustrating configuration examples of an input buffer of FIG. 12.
Figure 13B:
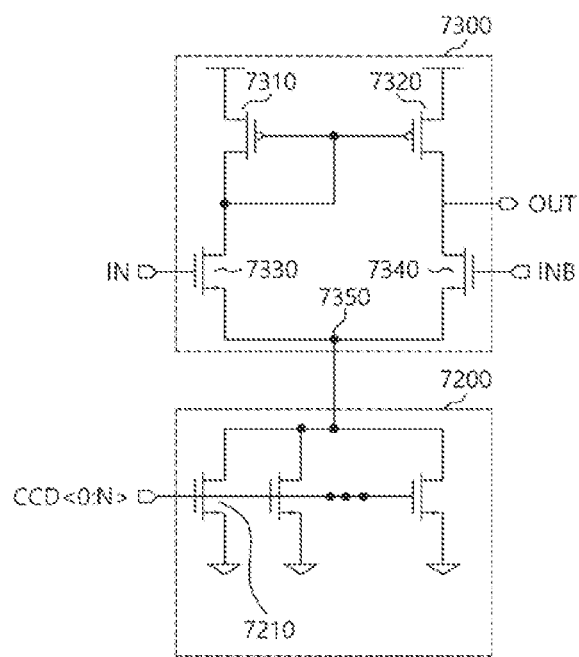

FIGS. 13A and 13B are diagrams illustrating configuration examples of the input buffer 7000 of FIG. 12.

The input buffer 7000 of FIG. 12 may be configured in various forms and for example, the input buffer 7000 may be configured as illustrated in FIGS. 13A and 13B.

Referring to FIG. 13A, the input buffer 7000 may include a buffering circuit 7100 and a current sink circuit 7200.

The buffering circuit 7100 may generate the differential output signals OUT and OUTB by buffering the differential input signals IN and INB.

The buffering circuit 7100 may include first and second resistors 7110 and 7120 and first and second transistors 7130 and 7140.

One end of the first and second resistors 7110 and 7120 may be coupled to a power terminal.

A drain terminal of the first transistor 7130 may be coupled to the other end of the first resistor 7110, a gate terminal of the first transistor 7130 may receive the input signal IN, and a source terminal of the first transistor 7130 may be coupled to a node 7150.

A drain terminal of the second transistor 7140 may be coupled to the other terminal of the second resistor 7120, a gate terminal of the second transistor 7140 may receive the input signal INB, and a source terminal of the second transistor 7140 may be coupled to the node 7150.

The output signal OUTB may be generated in a node to which the first resistor 7110 and the first transistor 7130 are coupled, and the output signal OUT may be generated in a node to which the second resistor 7120 and the second transistor 7140 are coupled.

The current sink circuit 7200 may control a sink current amount of the buffering circuit 7100 according to the skew compensation signal CCD<0:N>.

The current sink circuit 7200 may include a plurality of transistors 7210 coupled in parallel to the buffering circuit 7100.

Drain terminals of the plurality of transistors 7210 may be commonly coupled to the node 7150 of the buffering circuit 7100, source terminals thereof may be coupled to another terminal (for example, a ground terminal), and gate terminals thereof may receive signal bits of the skew compensation signal CCD<0:N> one by one.

Referring to FIG. 13B, the input buffer 7000 may include a buffering circuit 7300 and a current sink circuit 7200.

The buffering circuit 7300 may generate the output signal OUT by buffering the differential input signals IN and INB.

The buffering circuit 7300 may include first to fourth transistors 7310 to 7340.

A source terminal of the first transistor 7310 may be coupled to a power terminal and a drain terminal of the first transistor 7310 may be coupled to a gate terminal of the first transistor 7310.

A source terminal of the second transistor 7320 may be coupled to the power terminal and a gate terminal of the second transistor 7320 may be coupled to the gate terminal of the first transistor 7310.

A drain terminal of the third transistor 7330 may be coupled to the drain terminal of the first transistor 7310, a gate terminal of the third transistor 7330 may receive the input signal IN, and a source terminal of the third transistor 7330 may be coupled to a node 7350.

A drain terminal of the fourth transistor 7340 may be coupled to the drain terminal of the second transistor 7320, a gate terminal of the fourth transistor 7340 may receive the input signal INB, and a source terminal of the fourth transistor 7340 may be coupled to the node 7350.

The output signal OUT may be generated in a node to which the second transistor 7320 and the fourth transistor 7340 are coupled.

The current sink circuit 7200 may have the same configuration as the current sink circuit 7200 of FIG. 13A.

For example, when the threshold voltage of the transistor has a slow characteristic, the input buffer 7000 having the configurations as illustrated in FIGS. 13A and 13B may detect the slow characteristic of the threshold voltage, increase the number of transistors activated among the plurality of transistors 7210 according to the generated skew compensation signal CCD<0:N>, and thus increase the sink current. Accordingly, the slow characteristic in the threshold voltage of the transistor may be compensated.

When the threshold voltage of the transistor has a fast characteristic, the input buffer may detect the fast characteristic of the threshold voltage, reduce the number of transistors activated among the plurality of transistors 7210 according to the generated skew compensation signal CCD<0:N>, and thus reduce the sink current. Accordingly, the fast characteristic in the threshold voltage of the transistor may be compensated.

The above described embodiments of the present invention are intended to illustrate and not to limit the present invention. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims.

What is claimed is:

1. A semiconductor apparatus comprising:
   an input buffer configured to generate an output signal by buffering an input signal and controlling a sink current amount according to a skew compensation signal; and
   a skew compensation circuit configured to generate the skew compensation signal according to skew detection signal,
   wherein the skew compensation circuit includes a skew detection circuit configured to generate the skew detection signals by detecting threshold voltage characteristics of an NMOS transistor and a PMOS transistor.

2. The semiconductor apparatus of claim 1, wherein the input buffer includes:
   a buffering circuit configured to generate the output signal by buffering the input signal; and
   a current sink circuit configured to control a sink current amount of the buffering circuit according to the skew compensation signal.

3. The semiconductor apparatus of claim 1, wherein the skew detection circuit includes:
   a first detector configured to generate a first skew detection signal which is one of the skew detection signals by detecting the threshold voltage characteristic of the NMOS transistor according to a first clock signal; and
   a second detector configured to generate a second skew detection signal which is the other one of the skew detection signals by detecting the threshold voltage characteristic of the PMOS transistor according to a second clock signal.

4. The semiconductor apparatus of claim 1, wherein the skew compensation circuit further includes:
   a skew compensation signal generation circuit configured to generate the skew compensation signal by comparing the skew detection signals and a plurality of reference voltages; and
   a reference voltage generation circuit configured to generate the plurality of reference voltages of which offset components are compensated for according to variations of a temperature and an external voltage.

5. The semiconductor apparatus of claim 4, wherein the skew compensation signal generation circuit includes:
   a plurality of comparators configured to generate a plurality of comparison signals by comparing the plurality of reference voltages and the skew detection signals; and
   an encoder configured to generate the skew compensation signal by encoding the plurality of comparison signals.

6. The semiconductor apparatus of claim 4, wherein the reference voltage generation circuit includes:
   a reference voltage generator configured to generate a plurality of divided voltages;
   a multiplexing circuit configured to generate the plurality of reference voltages by selecting partially divided voltages among the plurality of divided voltages according to a temperature code; and
   a temperature sensor configured to detect a current temperature variation in the semiconductor apparatus and output a detection result as the temperature code.

7. The semiconductor apparatus of claim 4, further comprising a rectifier configured to provide a rectified voltage to the skew detection circuit and the reference voltage generation circuit where the rectified voltage is generated by rectifying an external voltage.

* * * * *